United States Patent
Saitoh et al.

(10) Patent No.: US 7,642,729 B2
(45) Date of Patent: Jan. 5, 2010

(54) LIGHT-EMITTING DEVICE DRIVING GEAR

(75) Inventors: Mitsuyori Saitoh, Itabashi-ku (JP); Hiroshi Watanabe, Toyko (JP)

(73) Assignee: Texas Instruments Incorporated, Dallas, TX (US)

( * ) Notice: Subject to any disclaimer, the term of this patent is extended or adjusted under 35 U.S.C. 154(b) by 350 days.

(21) Appl. No.: 11/778,530

(22) Filed: Jul. 16, 2007

(65) Prior Publication Data

US 2008/0013577 A1 Jan. 17, 2008

(51) Int. Cl.
*H05B 37/02* (2006.01)
(52) U.S. Cl. .................. 315/291; 315/307; 315/308
(58) Field of Classification Search .......... 315/291, 315/294, 295, 297, 299, 300, 302, 307, 308
See application file for complete search history.

(56) References Cited

U.S. PATENT DOCUMENTS 6,836,157 B2* 12/2004 Rader et al. ................ 327/66
6,909,249 B2* 6/2005 Otake ........................ 315/291

* cited by examiner

*Primary Examiner*—David Hung Vu
(74) *Attorney, Agent, or Firm*—William B. Kempler; Wade J. Brady, III; Frederick J. Telecky, Jr.

(57) ABSTRACT

When an APC selection signal FA is set to H level to start an APC operation, a monitor voltage $V_A$ is immediately generated from a monitor voltage generating circuit 16A, and an error voltage $V_{EA}$ corresponding to the difference between the monitor voltage $V_A$ and a reference voltage $V_P$ is output from an error amplifying circuit 18A. However, until the monitor voltage $V_A$ reaches the vicinity of the reference voltage $V_P$, a S/H circuit 20A is held in a hold mode, and a laser diode $LD_A$ is driven at a switching current $I_{SA}$ with the same current value as before the APC operation start. After the monitor voltage $V_A$ reaches the vicinity of the reference voltage $V_P$, the S/H circuit 20A is switched to a sampling mode, and a feedback control operation of a closed loop is started.

17 Claims, 6 Drawing Sheets

LIGHT-EMITTING DEVICE DRIVING GEAR

FIELD OF THE INVENTION

The present invention pertains to a device for driving the light emission of a light-emitting device. In particular, the present invention pertains to a light-emitting device driving gear having an APC (auto power control) function for constantly maintaining the optical output of a light-emitting device.

BACKGROUND OF THE INVENTION

As a representative example of a light-emitting device, a laser diode is well known. If a forward driving current is sent to the laser diode, electrons and holes are recoupled in an active layer region, so that photons are generated. The spontaneous emission light is reciprocated in the active layer by a feedback action, and laser oscillation (induced emission) results.

In general, a device for driving the laser diode is provided with an APC function for constantly maintaining the optical output or the amount of light generated, even if the characteristics of the laser diode have changed. This APC consists of a light-receiving device that receives light generated by the laser diode and generates a photocurrent corresponding to the optical output, a monitor voltage generating circuit for generating a monitor voltage with a size in which the photocurrent of the light-receiving device is multiplied by a prescribed coefficient, a differential amplifying circuit that compares the monitor voltage from the monitor voltage generating circuit with a reference voltage corresponding to a set value of the optical output generated by the laser diode and outputs an error voltage corresponding to the difference, a sample-and-hold circuit for sampling and holding the output voltage of the differential amplifying circuit, and a driving current generating circuit corresponding to the output voltage of the sample-and-hold circuit.

While the laser diode emits light in a stationary operating mode, the APC is not activated, and when the driving current supplied to the laser diode is reset, the APC is operated. In this case, a photocurrent corresponding to the optical output of the laser diode flows to the light-receiving device, and a monitor voltage corresponding to the photocurrent of the light-receiving device and the optical output of the laser diode is output from the monitor voltage generating circuit. Then, the monitor voltage is compared with the reference voltage in the error amplifying circuit, and an error voltage showing the difference or comparison error is sampled and held by the sample-and-hold circuit and given to the driving current generating circuit. The driving current generating circuit adopts the output voltage of the sample-and-hold circuit as a control voltage, generates a driving current with a current value corresponding to it, and supplies the driving current to the laser diode, and the laser diode emits light by the optical output corresponding to the current value of the driving current. If the laser diode emits light in this feedback loop and the monitor voltage reaches and converges to the reference voltage, that is, the optical output of the laser diode is equal to the set output, the feedback loop reaches an equilibrium state. In this equilibrium state, if the sample-and-hold circuit is switched from the sampling mode to the hold mode, the current value of the driving current supplied to the laser diode from the driving current generating circuit is held at the current value (reset current value) in said equilibrium state, even after switching from the APC operation to a stationary operation, so that the optical output of the laser diode is held at the set output. When the APC operation is finished, the monitor voltage generating circuit and the light-receiving device are turned off along with the mode switching of the above-mentioned sample-and-hold circuit.

In the conventional light-emitting device driving gear, when the APC operation is started, the monitor voltage generating circuit and the light-receiving device are switched from the off-state at that time to the on-state, and at the same time, the sample-and-hold circuit is switched from the current hold mode to a sampling mode.

In this case, immediately after starting the APC operation, when the monitor voltage output from the monitor voltage generating circuit raises from the level (usually, zero level) in the off-state at that time toward a reference voltage, a large error voltage is output from the error amplifying circuit, and the large error voltage is sampled by the sample-and-hold circuit and given to the driving current generating circuit. Thus, the current value of the driving current being output from the driving current generating circuit in accordance with the control voltage from the sample-and-hold circuit is increased from the set current value by that time, and the optical output of the laser diode is also changed in a rising direction from the value in the vicinity of the set output, so that the monitor output is further raised. Then, if the monitor voltage exceeds the reference voltage, the feedback loop of the APC is activated in the opposite direction, and an error voltage with a reversed polarity is output from the error amplifying circuit, so that the control voltage being given to the driving current generating circuit from the sample-and-hold circuit is lowered, thereby reducing or dropping the current value of the driving current, the optical output of the laser diode, and the monitor voltage. Eventually, the monitor voltage output from the monitor voltage generating circuit converges to the reference voltage and reaches the equilibrium state, and the current value of the driving current is optimally set so that the optical output of the laser diode is equal to the set output.

However, as mentioned above, if the current value of the driving current is largely increased once from the set value at that time, reduced to return to the original value, and adjusted to a new set value (reset value), the time required for completion from the start of the APC operation is somewhat lengthened. In an ordinary application, compared with the speed of the characteristic change of the laser diode, the APC operation is carried out in a very short cycle, and for example, in a laser printing head, the APC operation is carried out for a line scanning. Therefore, it is usual for the set current value of the driving current to be not largely different immediately before the start of the APC operation and immediately after the completion. Nevertheless, as mentioned above, not only can it be said that a uniform large up and down or increase and decrease of the control voltage and the driving current at each cycle is a useless operation or incorrect operation, but the characteristics of the laser diode are degraded by overcurrent drive during the APC operation, or acceleration of the degradation is likely.

A general object of the present invention is to solve the problems of the above-mentioned prior art, and is to provide a light-emitting device driving gear that efficiently carries out an APC operation without providing a meaningless overcurrent.

SUMMARY OF THE INVENTION

This and other objects and features are provided in accordance with one aspect of the present invention including a light-receiving device for converting the optical output of a light-emitting device into a photocurrent, a monitor voltage generating circuit that has a monitor resistor, in which the photocurrent of the above-mentioned light-receiving device or an output current proportional to it flows, and an on/off switch for switching the electrification/cut-off of the above-mentioned photocurrent or output current and outputs a monitor voltage corresponding to the voltage drop of the above-mentioned monitor resistor, an error amplifying circuit that compares the above-mentioned monitor voltage output from the above-mentioned monitor voltage generating circuit with a reference voltage corresponding to a set value of the optical output of the above-mentioned light-emitting device and outputs an error voltage corresponding to the difference, a sample-and-hold circuit in which the input terminal is connected to the output terminal of the above-mentioned error amplifying circuit and either a sampling mode for sampling and outputting the error voltage from the above-mentioned error amplifying circuit or a hold mode for holding the output voltage, regardless of the current input voltage, can be selectively switched, a driving current generating circuit for generating a driving current with a current value corresponding to the output voltage of the above-mentioned sample-and-hold circuit to drive the light emission of the above-mentioned light-emitting device, and a mode switching circuit that monitors the above-mentioned monitor voltage output from the above-mentioned monitor voltage generating circuit immediately after the above-mentioned on/off switch of the above-mentioned monitor voltage generating circuit is switched from the on-state to the off-state to reset the above-mentioned driving current, detects the arrival timing of the above-mentioned monitor voltage to the vicinity of the above-mentioned reference voltage, and switches the above-mentioned sample-and-hold circuit from the above-mentioned hold mode to the above-mentioned sampling mode.

In the above-mentioned constitution, if the on/off switch is switched from the off-state to the on-state, a photocurrent or an output current proportional to it flows in the monitor voltage generating circuit, and a monitor voltage with a voltage value proportional to the current value of the photocurrent is obtained from the monitor resistor. The monitor voltage is compared with the reference voltage in the error amplifying circuit, and the error voltage output from the error amplifying circuit is input into the sample-and-hold circuit. On the other hand, the mode switching circuit monitors the monitor voltage output from the monitor voltage generating circuit while maintaining the hold mode of the sample-and-hold circuit at that time. Thus, regardless of the value of the error voltage being output from the error amplifying circuit, a driving current of the current value corresponding to the output voltage of the sample-and-hold circuit in the hold mode is generated from the driving current generating circuit, and the light emission of the light-emitting device is driven by the driving current. Then, if the monitor voltage reaches the vicinity of the reference voltage, the mode switching circuit switches the sample-and-hold circuit from the hold mode to the sampling mode at this timing. Thus, the sample-and-hold circuit samples the error voltage from the error amplifying circuit, updates the output voltage in real time, activates the feedback control operation of a closed loop, and makes the monitor voltage approach unlimitedly to the reference voltage. Thus, the APC operation can be carried out with good efficiency without dependence on the application.

According to an another embodiment of the present invention, the mode switching circuit may have a differentiating circuit that inputs the monitor voltage and generates an output voltage showing a differential waveform of the monitor voltage and an output circuit that inputs the output voltage of the differentiating circuit and outputs a first switching signal to switch the sample-and-hold circuit from the hold mode to the sampling mode when the voltage drops to a level in the vicinity of zero. In this case, appropriately, the differentiating circuit is connected in series with a capacitor and a resistor, and a voltage between the ends of said resistor is adopted as the output voltage of the above-mentioned differentiating circuit. Also, the output circuit has a comparator in which a first input terminal is connected to one end of the resistor, a second input terminal is connected to the other end of the resistor, the sizes of a first input voltage being input into the first input terminal and a second input voltage being input into the second input terminal are compared, and a binary signal showing the comparison result is output as the first mode switching signal. More appropriately, the output circuit may have a bypass circuit connected to one end of the resistor and the first input terminal of the comparator or may have a bypass circuit connected to the other end of the resistor and the second input terminal of the comparator to give a prescribed bias to the input of the comparator. Furthermore, the comparator may have first and second bipolar transistors in which each base is connected to the first and second input terminals to constitute a differential input part.

Also, as another embodiment, the mode switching circuit may have a differentiating circuit that inputs the monitor voltage and generates a transient current showing a differential waveform of the monitor voltage; and an output circuit that outputs a first switching signal to switch the sample-and-hold circuit from the hold mode to the sampling mode when the current value of the transient current being generated in the differentiating circuit is reduced to the vicinity of zero.

Also, according to an embodiment, a switching circuit connected to the light-emitting device in series with the output terminal of the driving current generating circuit is installed. The switching circuit sends the driving current from the above-mentioned driving current generating circuit or cuts off the driving current in accordance with the logical level of an input signal provided as a binary signal or pulse signal.

Also, according to an embodiment, the monitor voltage generating circuit has a first transistor connected to the light-receiving device in series and a second transistor constituting a current mirror circuit along with the first transistor, and a monitor resistor and on/off switch are connected to the second transistor in series.

Also, according to an embodiment, after the lapse of a prescribed time from the moment when the on/off switch of the monitor voltage generating circuit is switched from the on-state to the off-state, the mode switching circuit outputs a second switching signal from switching the sample-and-hold circuit from the sampling mode to the hold mode.

Also, according to an embodiment, at almost the same time that the sample-and-hold circuit is switched from the sampling mode to the hold mode by the mode switching circuit, the mode selecting circuit switches the on/off switch of the monitor voltage generating circuit from the on-state to the off-state. The mode selecting circuit is also switched from the off-state to the on-state by the on/off switch. Furthermore, the mode selecting circuit selects switching from the hold mode to the sampling mode for the sample-and-hold circuit and switching from the sampling mode to the hold mode for the mode switching circuit.

The light-emitting device driving gear of another aspect of the present invention includes a light-receiving device for converting into a photocurrent the optical output of a first or second light-emitting device for selectively emitting light, a first monitor voltage generating circuit that has a first monitor resistor, in which the photocurrent of the above-mentioned light-receiving device or a first output current proportional to it flows when the above-mentioned first light-emitting device emits light, and a first on/off switch for switching the electrification/cut-off of the above-mentioned photocurrent or first output current and outputs a monitor voltage corresponding to the voltage drop of the above-mentioned first monitor resistor, a first error amplifying circuit that compares the output voltage of the above-mentioned first monitor voltage generating circuit with a first reference voltage corresponding to a set value of the optical output of the above-mentioned first light-emitting device and generates an error voltage corresponding to the difference, a first sample-and-hold circuit in which the input terminal is connected to the output terminal of the above-mentioned first error amplifying circuit and either a sampling mode for sampling and outputting the error voltage from the above-mentioned first error amplifying circuit or a hold mode for holding the output voltage, regardless of the current input voltage, can be selectively switched, a first driving current generating circuit for generating a first driving current with a current value corresponding to the output voltage of the above-mentioned first sample-and-hold circuit to drive the light emission of the above-mentioned first light-emitting device, a first mode switching circuit that monitors the above-mentioned first monitor voltage being output from the above-mentioned first monitor voltage generating circuit immediately after the above-mentioned first on/off switch of the above-mentioned first monitor voltage generating circuit is switched from the on-state to the off-state to reset the above-mentioned first driving current, detects the arrival timing of the above-mentioned first monitor voltage to the vicinity of the above-mentioned first reference voltage, and switches the above-mentioned first sample-and-hold circuit from the above-mentioned hold mode to the above-mentioned sampling mode, a second monitor voltage generating circuit that has a second monitor resistor, in which the photocurrent of the above-mentioned light-receiving device or a second output current proportional to it flows when the above-mentioned second light-emitting device emits light, and a second on/off switch for switching the electrification/cut-off of the above-mentioned photocurrent or second output current and outputs a second monitor voltage corresponding to the voltage drop of the above-mentioned second monitor resistor, a second error amplifying circuit that compares the output voltage of the above-mentioned second monitor voltage generating circuit with a second reference voltage corresponding to a set value of the optical output of the above-mentioned second light-emitting device and generates an error voltage corresponding to the difference, a second sample-and-hold circuit in which the input terminal is connected to the output terminal of the above-mentioned second error amplifying circuit and either a sampling mode for sampling and outputting the error voltage from the above-mentioned second error amplifying circuit or a hold mode for holding the output voltage, regardless of the current input voltage, can be selectively switched, a second driving current generating circuit for generating a second driving current with a current value corresponding to the output voltage of the above-mentioned second sample-and-hold circuit to drive the light emission of the above-mentioned second light-emitting device, and a second mode switching circuit that monitors the above-mentioned second monitor voltage output from the above-mentioned second monitor voltage generating circuit immediately after the above-mentioned second on/off switch of the above-mentioned second monitor voltage generating circuit is switched from the on-state to the off-state to reset the above-mentioned second driving current, detects the arrival timing of the above-mentioned second monitor voltage to the vicinity of the above-mentioned second reference voltage, and switches the above-mentioned second sample-and-hold circuit from the above-mentioned hold mode to the above-mentioned sampling mode.

Also, the light-emitting device driving gear from another aspect of the present invention includes a light-receiving device for converting into a photocurrent the optical output of a light-emitting device for selectively emitting light, a first monitor voltage generating circuit that has a first monitor resistor, in which the photocurrent of the above-mentioned light-receiving device or a first output current proportional to it flows selectively when the above-mentioned light-emitting device emits light, and outputs a first monitor voltage corresponding to the voltage drop of the above-mentioned first monitor resistor, a first error amplifying circuit that compares the output voltage of the above-mentioned first monitor voltage generating circuit with a first reference voltage corresponding to a set value of the optical output of the above-mentioned light-emitting device and generates an error voltage corresponding to the difference, a first sample-and-hold circuit in which the input terminal is connected to the output terminal of the above-mentioned first error amplifying circuit and either a sampling mode for sampling and outputting the error voltage from the above-mentioned first error amplifying circuit or a hold mode for holding the output voltage, regardless of the current input voltage, can be selectively switched, a driving current generating circuit for generating a driving current with a current value corresponding to the output voltage of the above-mentioned first sample-and-hold circuit to drive the light emission of the above-mentioned light-emitting device, a second monitor voltage generating circuit that has a second monitor resistor, in which the photocurrent of the above-mentioned light-receiving device or a second output current proportional to it flows when the above-mentioned light-emitting device emits light, and outputs a second monitor voltage corresponding to the voltage drop of the above-mentioned second monitor resistor, a second error amplifying circuit that compares the output voltage of the above-mentioned second monitor voltage generating circuit with a second reference voltage corresponding to a bias current set value selected in the vicinity of a threshold current value of the above-mentioned light-emitting device and generates an error voltage corresponding to the difference, a second sample-and-hold circuit in which the input terminal is connected to the output terminal of the above-mentioned second error amplifying circuit and either a sampling mode for sampling and outputting the error voltage from the above-mentioned second error amplifying circuit or a hold mode for holding the output voltage, regardless of the current input voltage, can be selectively switched, a bias current generating circuit for generating a bias current with a current value corresponding to the output voltage of the above-mentioned second sample-and-hold circuit to bias the above-mentioned light-emitting device, a changeover switch that can be switched to a first switch position for sending the above-mentioned photocurrent or the above-mentioned first output current to the above-mentioned first monitor resistor or a second switch position for sending the above-mentioned photocurrent or the above-mentioned second output current to the above-mentioned second monitor resistor when the above-mentioned light-emitting device emits light, a first mode switching circuit that monitors the above-mentioned first monitor voltage output from the above-mentioned first monitor voltage generating circuit immediately after the above-mentioned changeover switch is switched to the above-mentioned first switch position to reset the above-mentioned driving current, detects the arrival timing of the above-mentioned first monitor voltage to the vicinity of the above-mentioned first reference voltage, and switches the above-mentioned first sample-and-hold circuit from the above-mentioned hold mode to the above-mentioned sampling mode, and a second mode switching circuit that monitors the above-mentioned second monitor voltage output from the above-mentioned second monitor voltage generating circuit immediately after the above-mentioned changeover switch is switched to the above-mentioned second switch position to reset the above-mentioned driving current, detects the arrival timing of the above-mentioned second monitor voltage to the vicinity of the above-mentioned second reference voltage, and switches the above-mentioned second sample-and-hold circuit from the above-mentioned hold mode to the above-mentioned sampling mode.

REFERENCE NUMERALS AND SYMBOLS AS SHOWN IN THE DRAWINGS

In the FIGS. 10, 10A, 10B represent a LD driving part, 12, 12A, 12B, 108 represents a voltage-current converting circuit (driving current generating circuit), 14, 14A, 14B represents a switching circuit, 16, 16A, 16B, 102, represents a monitor voltage generating circuit, 18, 18A, 18B, 104 represents an error amplifying circuit, 20, 20A, 20B, 106 represents a S/H (sample-and-hold) circuit, 22, 22A, 22B, 110 represents a timing generating circuit, 30, 130 represents a monitor resistor, 32 represents a differentiating circuit, 40 represents a comparator, 44 represents a bias circuit, 50, 124 represents a APC selecting circuit, LD, $LD_A$, $LD_B$ represents a Laser diode, PD represents a photodiode.

Description of the Embodiments

According to the light-emitting device driving gear of one aspect of the present invention, with the above-mentioned constitution and operation, an APC operation can be efficiently carried out without providing meaningless overcurrent to the light-emitting device Next, an embodiment of the present invention will be explained referring to the attached figures.

Figure 1:
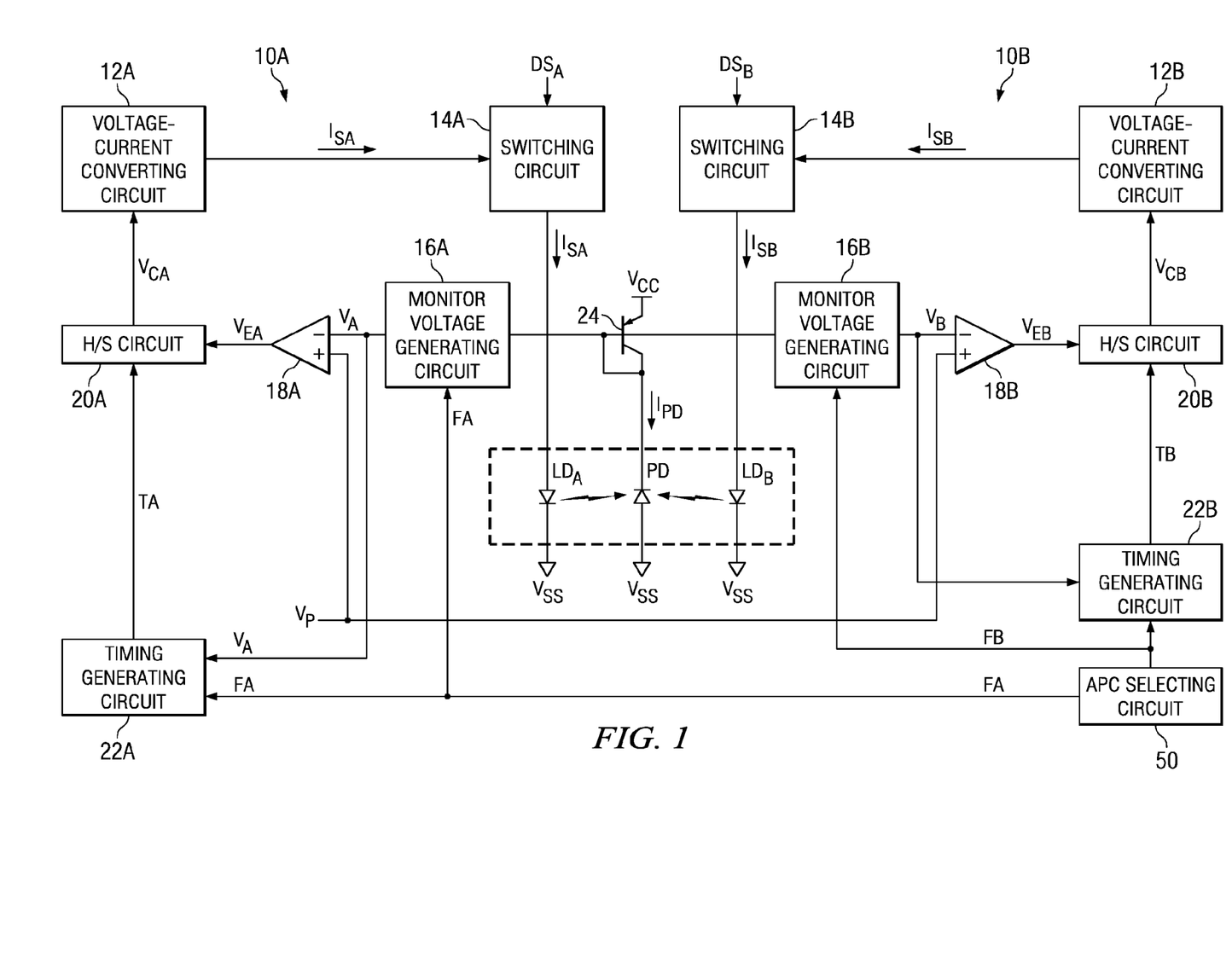
FIG. 1 is a block diagram showing the constitution of the two-channel laser diode driving gear in an embodiment of the present invention.

FIG. 1 shows a circuit constitution of the light-emitting device driving gear of an embodiment of the present invention. This light-emitting device driving gear is constituted as a two-channel laser diode driving gear for driving laser diodes $LD_A$ and $LD_B$ of two channels as an example of a multichannel light-emitting device and is equipped with two independently operable LD driving parts 10A and 10B and an APC selecting circuit 50.

The first LD driving part 10A for driving the laser diode $LD_A$ of the first channel consists of voltage-current converting circuit (driving current generating circuit 12A, switching circuit 14A, photodiode PD, monitor voltage generating circuit 16A, error amplifying circuit 18A, S/H (sample-and-hold) circuit 20A, and timing generating circuit (mode switching circuit) 22A.

The second LD driving part 10B for driving the laser diode $LD_B$ of the second channel consists of voltage-current converting circuit (driving current generating circuit0 12B, switching circuit 14B, photodiode PD, monitor voltage generating circuit 16B, error amplifying circuit 18B, S/H circuit 20B, and timing generating circuit (mode switching circuit) 22B.

The photodiode PD can receive both a laser beam generated by the laser diode $LD_A$ of the first channel and a laser beam generated by the laser diode $LD_B$ of the second channel and is shared in a time division by the APC of the first LD driving part 10A and the APC of the second LD driving part 10B. As will be mentioned later, an on/off switch 28 (FIG. 2) provided to both monitor voltage generating circuits 16A and 16B is nonsimultaneously turned on under the control of an APC selecting circuit 50, so that the first LD driving part 10A and the second LD driving part 10B can carry out each APC operation in a time division or in turn.

Figure 2:
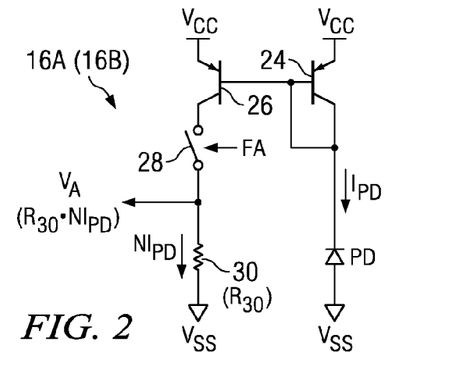
FIG. 2 is a circuit diagram showing a conventional example of a monitor voltage generating circuit in the driving gear of the embodiment.

In the first LD driving part 10A, the monitor voltage generating circuit 16A, for example, has a current mirror circuit as shown in FIG. 2. More specifically, the current mirror circuit consists of a pair of PNP transistors 24 and 26. The photodiode PD is connected in series with one PNP transistor 24, and the on/off switch 28 and a monitor resistor 30 are connected in series with the other transistor 26. Here, the on/off switch 28 is on/off-controlled by an APC selection signal FA from the APC selecting circuit 50 that will be mentioned later. For example, when FA=H level, the switch is in the on-state, and when FB=L level, the switch is in the off-state. If the current mirror ratio is N and the resistance value of the monitor resistor 30 is $R_{30}$, when the laser diode $LD_A$ (FIG. 1) of the first channel emits light and the on/off switch 28 is turned on, an output current represented by $NI_{PD}$ flows to the monitor resistor 30, and a monitor voltage $V_A$ represented by $R_{30}*NI_{PD}$ is drawn out of the terminal of the monitor resistor 30.

In FIG. 1, the error amplifying circuit 18A is constituted by an operational amplifier, inputs the monitor voltage $V_A$ output from the monitor voltage generating circuit 16A into one (negative polarity) input terminal, an APC reference voltage $V_P$ from a reference voltage generating circuit (not shown in the figure) is input into the other (positive polarity) input terminal, and an error voltage $V_{EA}$ corresponding to the difference in two input voltages $V_A$ and $V_P$ is output. The S/H circuit 20A samples and holds the error voltage $V_{EA}$ from the error amplifying circuit 18A.

More specifically, the S/H circuit 20A is switched in mode by an output (mode switching signal) TA of the timing generating circuit 22A that will be mentioned later. For example, when TA=H level, the circuit is in a sampling mode, and when TA=L level, the circuit is in a hold mode. In the sampling mode, the error voltage $V_{EA}$ from the error amplifying circuit 18A is sampled, and the sampled error voltage $V_{EA}$ is adopted as a control voltage $V_{CA}$, or the error voltage $V_{EA}$ is added to a prescribed central voltage and output as the control voltage $V_{CA}$. In the hold mode, the control voltage (output voltage) $V_{CA}$ at that time is held, regardless of the current input voltage. Also, the above-mentioned central voltage can be provided to the output voltage of the error amplifying circuit 18A.

The voltage-current converting circuit 12A generates from the S/H circuit 20A a driving current or switching current $I_{SA}$ with a current value corresponding to the control voltage $V_{CA}$. The switching circuit 14A connected in series between the voltage-current converting circuit 12A and the laser diode $LD_A$ is constituted by a switching device that enables an on/off operation at high frequency and inputs the switching current $I_{SA}$ from the voltage-current converting circuit 12A. In accordance with the input signal $DS_A$ provided as a binary signal or pulse signal, the switching current $I_{SA}$ is sent to the laser diode $LD_A$ when $DS_A$=H level, and the switching current $I_{SA}$ is cut off when $DS_A$=L level. Also, the laser diode $LD_A$ is a cathode ground type, its cathode terminal is connected to a negative electrode side power supply voltage terminal $V_{SS}$, and its anode terminal is connected to the output terminal of the switching circuit 14A.

The timing generating circuit 22A is a circuit that switches the mode of the S/H circuit 20A in response to the APC selection signal FA from the APC selecting circuit 50, and in particular, immediately after the start of the APC operation, the monitor voltage $V_A$ output from the monitor voltage generating circuit 16A is monitored, the timing at which the monitor voltage $V_A$ rises to the vicinity of the reference voltage $V_P$ is detected, the output signal TA to the S/H circuit 20A is switched from L level to H level, and the S/H circuit 20A is switched from the hold mode at that time to the sampling mode.

Figure 3:
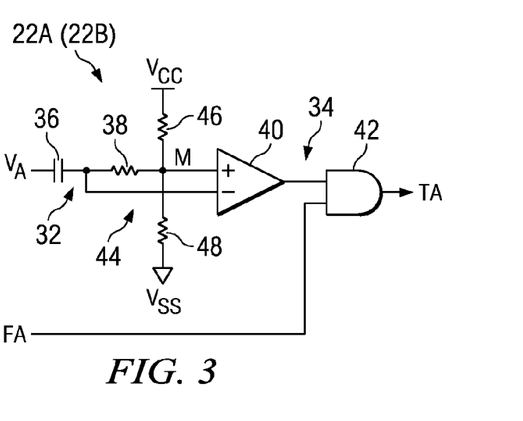
FIG. 3 is a circuit diagram showing a conventional example of a timing generating circuit in the driving gear of the embodiment.

FIG. 3 shows a constitutional example of the timing generating circuit 22A. The timing generating circuit 22A of this constitutional example has a differentiating circuit 32 that inputs the monitor voltage $V_A$ from the monitor voltage generating circuit 16A (FIGS. 1 and 2) and generates an output voltage showing a differential waveform of the monitor voltage $V_A$ and an output voltage circuit 34 that inputs the output voltage of the differentiating circuit 32 and switches the output signal TA from L level to H level when the voltage decreases to the vicinity of zero.

More specifically, the differentiating circuit 32 has a capacitor 36 and a resistor 38 connected in series, and the voltage between the ends of the resistor 38 is adopted as the output voltage of the differentiating circuit 32. Also, the output circuit 34 consists of a comparator 40 and an AND gate 42. Here, one terminal of the resistor 38 is connected to the positive electrode side input terminal (+) of the comparator 40, the other (at the capacitor 36) terminal of the resistor 38 is connected to the negative electrode side input terminal (−) of the comparator 40, and the output terminal of the comparator 40 is connected to one input terminal of the AND gate 42. The APC selection signal FA from the APC selecting circuit 50 (FIG. 1) is provided to the other input terminal of the AND gate 42. The output terminal of the AND gate 42 is connected to a mode changeover switch (not shown in the figure) provided in the S/H circuit 20A (FIG. 1).

Furthermore, a bias circuit 44 for providing a prescribed bias to the input of the comparator 40 is also installed. The bias circuit shown in the figure consists of two resistors 46 and 48 connected in series between the positive electrode side power supply voltage $V_{CC}$ and the negative electrode side power supply voltage terminal $V_{SS}$, and a node M between two resistors 46 and 48 is connected to one terminal of the resistor 38 of the differentiating circuit 32 and the positive electrode side input terminal (+) of the comparator 40. The operation of the timing generating circuit 22A is explained in detail in the overall operation of the first LD driving part 10A mentioned below.

Figure 5:
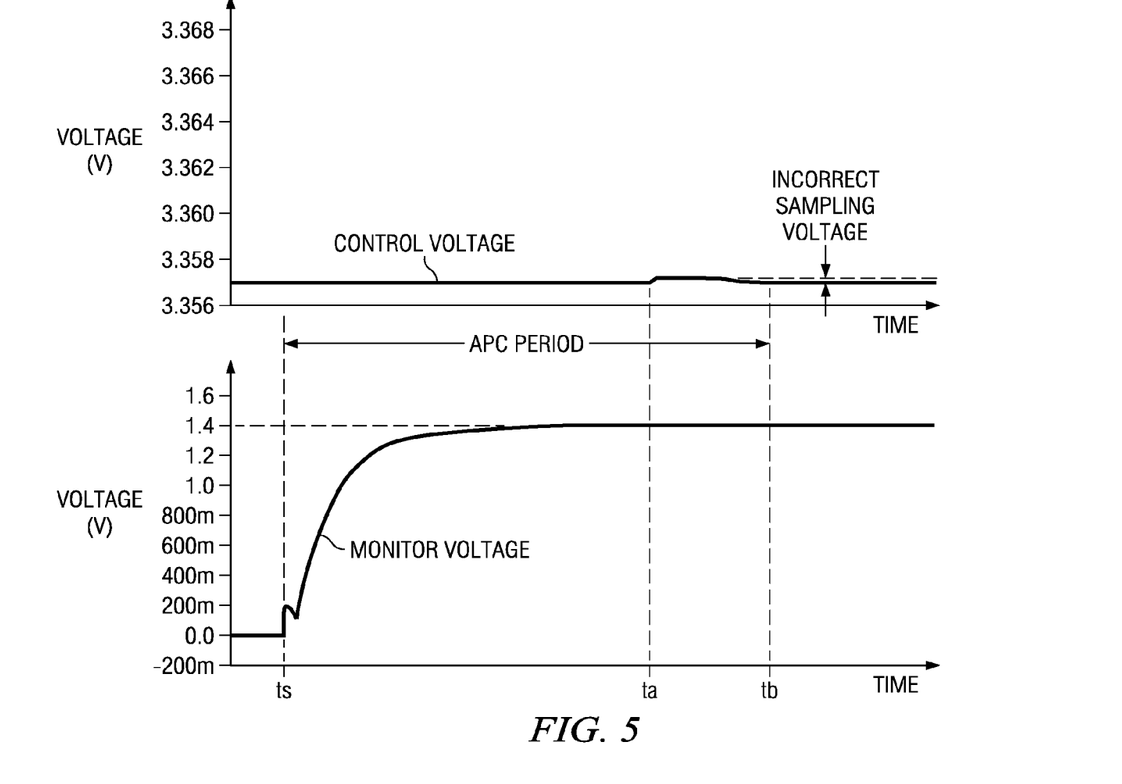
FIG. 5 is a waveform diagram showing waveforms of a monitor voltage and a control voltage in an APC operation of the driving gear of the embodiment.

Next, referring to FIGS. 1-3 and 5, the operation of the first LD driving part 10A will be explained. Also, FIG. 5 shows an example of waveforms (simulation waveforms) of the monitor voltages ($V_A$, $V_B$) and the control voltages ($V_{CA}$, $V_{CB}$) in the APC operation of the 2-channel laser diode driving gear shown in FIG. 1-3.

While the APC operation is carried out (before time $t_s$ of FIG. 5) in the first LD driving part 10A, the APC selecting signal FA is given at L level (disable state) from the APC selecting circuit 50 (FIG. 1). Thus, the on/off switch 28 (FIG. 2) of the monitor voltage generating circuit 16A is turned off. Even if the laser diode $LD_A$ of the first channel emits light, a monitor voltage $V_A$ is not generated from the monitor voltage generating circuit 16A, and the negative electrode side power supply voltage $V_{SS}$ (for example, zero volts) is given as an output voltage of the monitor voltage generating circuit 16A to the error amplifying circuit 18A.

Also, in the timing generating circuit 22A, since the APC selecting signal FA input into one input terminal of the AND gate 42 is at L level, the output signal TA of the AND gate 42 is maintained at L level. Since the output signal TA of the timing generating circuit 22A is at L level, the S/H circuit 20A is in the hold mode, and the output voltage (control voltage) $V_{CA}$ is held, regardless of its input voltage. Therefore, the voltage-current converting circuit 12A generates a switching current $I_{SA}$ with a current value corresponding to a prescribed control voltage $V_{SH}$ given from the S/H circuit 18A. The switching circuit 14A carries out a switching operation in accordance with the input signal $DS_A$ given in stationary operation mode. When the input signal $DS_A$ is at H level, the switching circuit 14A is turned on, and the switching current $I_{SA}$ from the voltage-current converting circuit 12A is supplied to the laser diode $LD_A$ of the first channel, so that said laser diode $LD_A$ emits light.

Also, the monitor voltage $V_A$ is not input into the timing generating circuit 22A from the monitor voltage generating circuit 16A, and the capacitor 36 of the differentiating circuit 32 cuts off the input voltage, that is, the negative electrode side power supply voltage $V_{SS}$ in a direct current fashion, and part (a fine current in the order of mAs or smaller) of the current flowing in the bias circuit 44 flows into the negative electrode side input terminal (−) of the comparator 40 through the resistor 38 of the differentiating circuit 32 from the node M. Thus, in the comparator 40, the input voltage of the positive electrode side input terminal (+) is higher than the input voltage of the negative electrode side input terminal (−) by the voltage drop portion of the resistor 38, and a signal at H level is output to its output terminal.

When the APC operation is carried out by the first LD driving part 10A, the APC selecting circuit 50 switches the APC selection signal FA from L level at that time to H level (enable state). Also, for the APC operation, for example, the input terminal at the input signal $DS_A$ is fixed at H level, and the switching circuit 14A is forcedly set in the on-state.

If the APC selection signal FA is at H level, the on/off switch 28 (FIG. 2) is turned on in the monitor voltage generating circuit 16A, the light generated by the laser diode $LD_A$ of the first channel is converted at a fixed ratio into a photocurrent $I_{PD}$ by the photodiode PD, and the photocurrent $I_{PD}$ is converted at a fixed ratio into the monitor voltage $V_A$. In this case, after the on/off switch 28 (FIG. 2) is turned on, the output current flowing in the monitor resistor 30 increases from the current value (zero amperes) at that time, and as shown in FIG. 5, the monitor voltage $V_A$ rises from the voltage level (zero volts) of the negative electrode side power supply voltage $V_{SS}$. Thus, the monitor voltage $V_A$ for starting an increase in the positive direction from the voltage level (zero volts) of the negative electrode side power supply voltage $V_{SS}$ is input into the inverted input terminal (−) of the error amplifying circuit 18A and is also input into the timing generating circuit 22A.

In the timing generating circuit 22A, when the monitor voltage $V_A$ from the monitor voltage generating circuit 16A starts the above-mentioned rise transition, a transient current $I_C$ with a positive polarity showing the differential waveform of the monitor voltage $V_A$ flows in the capacitor 36 and the resistor 38 of the differentiating circuit 34, and a voltage drop in which the terminal connected to the capacitor 36 has a potential higher than that of the terminal at its opposite side is generated between the ends of the resistor 38. At that time, a backward bias current flows in the resistor 38 from the bias circuit 44, but the bias current can be set at a negligible fine current, compared with the transient current $I_C$. Thus, an output voltage with a positive polarity showing the differential waveform of the monitor voltage $V_A$ is input into two input terminals (+) and (−) of the comparator 40 from the resistor 38 of the differentiating circuit 34, so that the output of the comparator 40 is changed from H level at that time to L level. In the AND gate 42, even if the APC selection signal FA input into one input terminal is at H level, since the output signal of the comparator 40 input into the other input terminal is almost simultaneously changed from H level to L level, the output terminal TA is maintained at the logical level at that time, that is, L level.

As mentioned above, if the APC selection signal FA is changed to H level to start the APC operation, although the monitor voltage $V_A$ is immediately generated from the monitor voltage generating circuit 16A and an error voltage $V_{EA}$ corresponding to the difference between the monitor voltage $V_A$ and the reference voltage $V_P$ is output from the error amplifying circuit 18A, since the output signal TA of the timing generating circuit 22A given to the S/H circuit 20A maintains the logical level (L level) for a while, the output voltage (control voltage) $V_{CA}$ of the S/H circuit 20A maintains the same value at that time as shown in FIG. 5 in the meantime. Thus, the light emission of the laser diode $LD_A$ in the current APC operation is started by the switching current $I_{SA}$ of the current value reset by the previous APC operation, and a feedback control operation of a closed loop for raising the monitor voltage $V_A$ until the monitor voltage $V_A$ reaches the reference voltage $V_P$ is carried out in the first LD driving part 10A.

Then, in the timing generating circuit 22A, if the transient current $I_c$ with a positive polarity flowing in the differentiating circuit 34 is reduced to the vicinity of zero and the polarity of the voltage drop of the resistor 38 is inverted, that is, in a strict sense, if the transient current $I_C$ is smaller than the backward bias current supplied to the resistor 38 from the bias circuit 44, the output signal of the comparator 40 is changed from L level at that time to H level. Thus, the output signal TA of the AND gate 42 is changed from L level at that time to H level, and the S/H circuit 20A is switched from the hold mode to the sampling mode in response to it. If the hold mode is changed to the sampling mode, the S/H circuit 20A samples and introduces the error voltage $V_{EA}$ from the error amplifying circuit 18A and updates the output voltage (control voltage) $V_{CA}$ in accordance with the error voltage $V_{EA}$ in real time.

Usually, when the hold mode is switched to the sampling mode, since the monitor voltage $V_A$ reaches a level slightly lower than the reference voltage $V_S$, the error voltage $V_{EA}$ shows a positive-polarity value, and as shown in FIG. 5, the output voltage (control voltage) $V_{CA}$ of the S/H circuit 20A rises slightly from the stationary value at that time (time $t_a$ of FIG. 5). In response to the slight rise of the control voltage $V_{CA}$, the switching current $I_{SA}$ output from the voltage-current converting circuit 12A increases slightly, the optical output of the laser diode $LD_A$ rises slightly, and the monitor voltage $V_A$ increases slightly. Then, at the moment the monitor voltage $V_A$ exceeds the reference voltage $V_P$ and the error voltage $V_{EA}$ is changed from a positive polarity to a negative polarity, the control voltage $V_{CA}$ turns downward, the switching current $I_{SA}$ is reduced, and the optical output of the laser diode $LD_A$ and the monitor voltage $V_A$ are reduced or lowered and rapidly approach unlimitedly the reference voltage $V_P$ (time $t_b$ of FIG. 5). Thus, the feedback control operation of a closed loop in the first LD driving part 10A reaches an equilibrium state.

The APC selecting circuit 50 estimates the timing at which the APC operation is completed (time $t_b$ of FIG. 5) and returns the APC control signal from H level to L level after the lapse of fixed time from the APC start time ($t_s$). Thus, the output signal TA of the timing generating circuit 22A is changed from H level to L level, and the S/H circuit 20A is switched from the sampling mode to the hold mode. Thus, the output voltage (control voltage) $V_{CA}$ of the S/H circuit 20A and the current value of the switching current $I_{SA}$ are fixed to reset to a value in an equilibrium state, that is, a value for which the optical output of the laser diode $LD_A$ is equal to the set output.

Thus, in this embodiment, until the monitor voltage $V_A$ reaches the vicinity of the reference voltage $V_P$ after the start of the APC operation, the S/H circuit 20A is held in the hold mode, and the laser diode $LD_A$ is driven at the switching current $I_{SA}$ with the same current value (the current value reset by the previous APC operation) as before the APC operation start. After the monitor voltage $V_A$ reaches the vicinity of the reference voltage $V_P$, the S/H circuit 20A is switched to the sampling mode, and the feedback control operation of a closed loop is started. Thus, the width (error sampling voltage of FIG. 5) for raising and lowering the control voltage $V_{CA}$ during the APC operation is very narrow, the time (APC period of FIG. 5) required for the completion from the start of the APC operation can be shortened, and a substantial overcurrent is not sent to the laser diode $LD_A$ for the APC, so that degradation of the laser diode characteristics and the decrease in the reliability can be prevented.

Also, a method for reducing the variation width of the control voltage $V_{CA}$ in the APC operation by delaying the operation of the S/H circuit 20A for a fixed time until the monitor voltage $V_A$ rises sufficiently can be considered. However, the rise time of the monitor voltage $V_A$ depends on the current value of the photocurrent $I_{PD}$ of the photodiode PD and the resistance value $R_{30}$ of the monitor resistor 30 determined by the application, and the method is insufficient regarding the delay for a fixed time. It is not suitable for solving the problems. Like the present invention, with the method for delaying the sampling operation of the S/H circuit 20A in accordance with the application until the monitor voltage $V_A$ reaches the vicinity of the control voltage $V_{CA}$, the variation of the control voltage $V_{CA}$ is suppressed to the minimum, and the APC period can be shortened. Furthermore, in this embodiment, a complicated analog arithmetic circuit is not required, and relatively simple circuits such as a differentiating circuit and comparator are adopted.

The second LD driving part 10B has a constitution and operation similar to those of the above-mentioned first LD driving part 10A. In other words, voltage-current converting circuit 12B, switching circuit 14B, monitor voltage generating circuit 16B, error amplifying circuit 18B, S/H circuit 20B, and timing generating circuit 22B in the second LD driving part 10B respectively correspond to the voltage-current converting circuit 12A, switching circuit 14A, monitor voltage generating circuit 16A, error amplifying circuit 18A, S/H circuit 20A, and timing generating circuit 22A in the first LD driving part 10A. Also, the laser diode $LD_B$ of the second channel corresponds to the laser diode $LD_A$ of the first channel. Since there is a difference in the characteristic change of two laser diodes $LD_A$ and $LD_B$, the values of each part in the APC loop, for example, monitor voltages ($V_A$, $V_B$), error voltages ($V_{EA}$, $V_{EB}$), output voltages or control voltages ($V_{CA}$, $V_{CB}$) of S/H circuits 20A and 20B, switching currents ($I_{SA}$, $I_{SB}$), etc., are different, and the time required for the APC is sometimes different.

Usually, the APC operation is implemented in the first channel and the second channel in order or in the reversed sequence for a fixed period. For example, in a laser printing head, the APC operations of both channels are sequentially implemented for a continuous scanning period. Then, after finishing the APC operation, the first and second LD driving parts 10A and 10B are transferred into a stationary operation mode or data mode, and the light emission of the laser diodes $LD_A$ and $LD_B$ is individually or simultaneously driven in accordance with each input signal $DS_A$ and $DS_B$. At that time, the laser diodes $LD_A$ and $LD_B$ are respectively driven by the switching currents $I_{SA}$ and $I_{SB}$ reset by the APC operation immediately before said line scanning.

Figure 4:
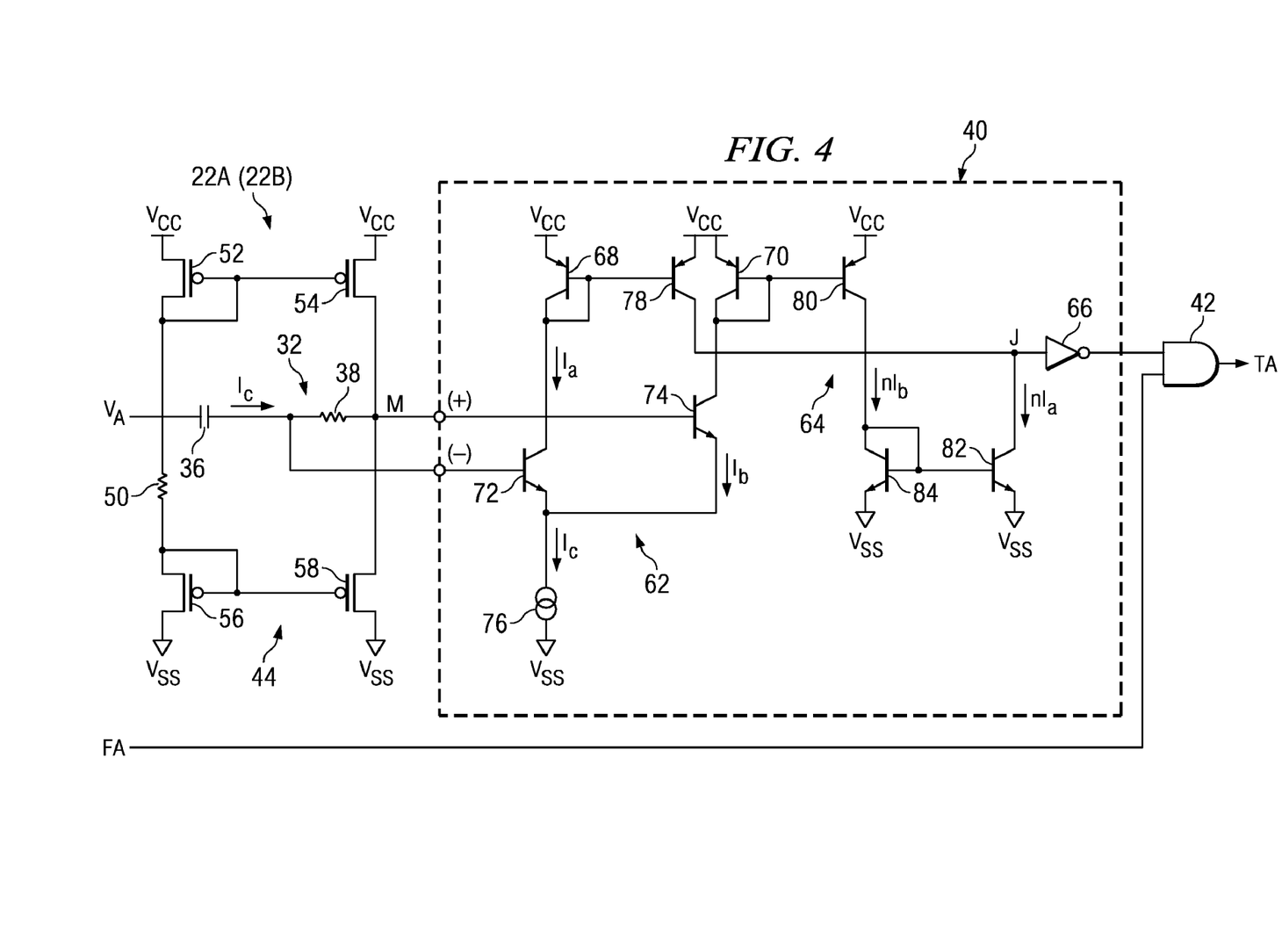
FIG. 4 is a circuit diagram showing a more detailed constitutional example of the timing generating circuit in the driving gear of the embodiment.

FIG. 4 shows a more detailed circuit constitution example of the timing generating circuit 22A (22B) of FIG. 3. The bias circuit 44 is constituted as a constant-current circuit consisting of PMOS transistors 52 and 54, NMOS transistors 56 and 58, and resistor 60. More specifically, the PMOS transistor 52, resistor 60, and NMOS transistor 56 are connected in series between the positive electrode side power supply voltage terminal $V_{CC}$ and the negative electrode side power supply voltage terminal $V_{SS}$, and the gate and the drain are diode-connected in each transistor 52 and 58. PMOS transistors 54 and NMOS transistor 58 are connected in series between positive electrode side power supply voltage terminal $V_{CC}$ and negative electrode side power supply voltage terminal $V_{SS}$. Also, the gates of the transistors 54 and 58 are respectively connected to the gates of the transistors 52 and 56, and the node M is installed between each drain of the transistors 54 and 58.

The comparator 40 consists of differential input part 62, amplifying part 64, and inverter 66. Here, the differential input part 62 consists of PNP transistors 68 and 70, NPN transistors 72 and 74, and constant-current source circuit 76. More specifically, between the positive electrode side power supply voltage terminal $V_{CC}$ and the negative electrode side power supply voltage terminal $V_{SS}$, the PNP transistor 68, NPN transistor 72, and constant-current source circuit 76 are connected in series, and the PNP transistor 70, NPN transistor 74, and constant-current source circuit 76 are connected in series, so that an inverted input terminal (−) and a non-inverted input terminal (+) are respectively connected to the bases of the NPN transistors 72 and 74. In the differential input part 62, a current $I_a$ flowing serially in the PNP transistor 68 and the NPN transistor 72 and a current $I_b$ flowing serially in the PNP transistor 70 and the NPN transistor 74 are joined (added), so that a constant current $I_c$ ($I_c=I_a+I_b$) of the constant-current source circuit 76 is formed.

The amplifying circuit 64 consists of PNP transistors 78 and 80 and NPN transistors 82 and 84. More specifically, the PNP transistors 78 and 80 respectively constitute a current mirror circuit along with the PNP transistors 68 and 70 of the differential input part 62, and the NPN transistors 82 and 84 are respectively connected in series to the PNP transistors 78 and 80. Furthermore, the base and collector of the NPN transistor 84 and the base of the NPN transistor 82 are commonly connected, and currents shown by $nI_a$ and $nI_b$ flow in PNP transistors 82 and 84, respectively. Here, n is a current mirror ratio. Also, a node J installed between the drain of the PNP transistor 78 and the collector of the NPN transistor 82 is connected to the input terminal of the inverter 66. The output terminal of the inverter 66 is connected as an output terminal of the comparator 40 to one input terminal of the AND gate 42.

In the comparator 40, when the monitor voltage $V_A$ as an input voltage does not rise, that is, when the current $I_c$ with a positive polarity does not flow to the differential circuit 32, a relatively large bias current is supplied to the base of the input transistor 74 of the differential input part 62 by the bias circuit 44, and a very small bias current is supplied to the base of the input transistor 72. Thus, compared with the current $I_b$ flowing in the transistor 74, a very small current $I_a$ flows in the transistor 72, the current $nI_a$ flowing in the output transistor 82 is also small, and an output voltage at H level appears in the output terminal of the inverter 66.

However, during the rising transition of the monitor voltage $V_A$ as input voltage, that is, while the transient current $I_c$ with a positive polarity flows in the differential circuit 32, the base voltage of the input transistor 72 is relatively higher than the base voltage of the input transistor 74 through the resistor 38, so that the size relation of the currents $I_a$ and $I_b$ flowing respectively in input transistors 72 and 74 is reversed. Thereby, the current $nI_a$ flowing in the output transistor 82 increases, and an output voltage at L level appears at the output terminal of the inverter 66.

Thus, in this embodiment, since the transistors in the comparator 40, especially the input transistors 72 and 74 of the differential input part 62 are constituted by bipolar transistors, the bias circuit 44 is activated as a current bias circuit, and a comparator operation with high-speed response or high-sensitivity can be realized.

Figure 6:
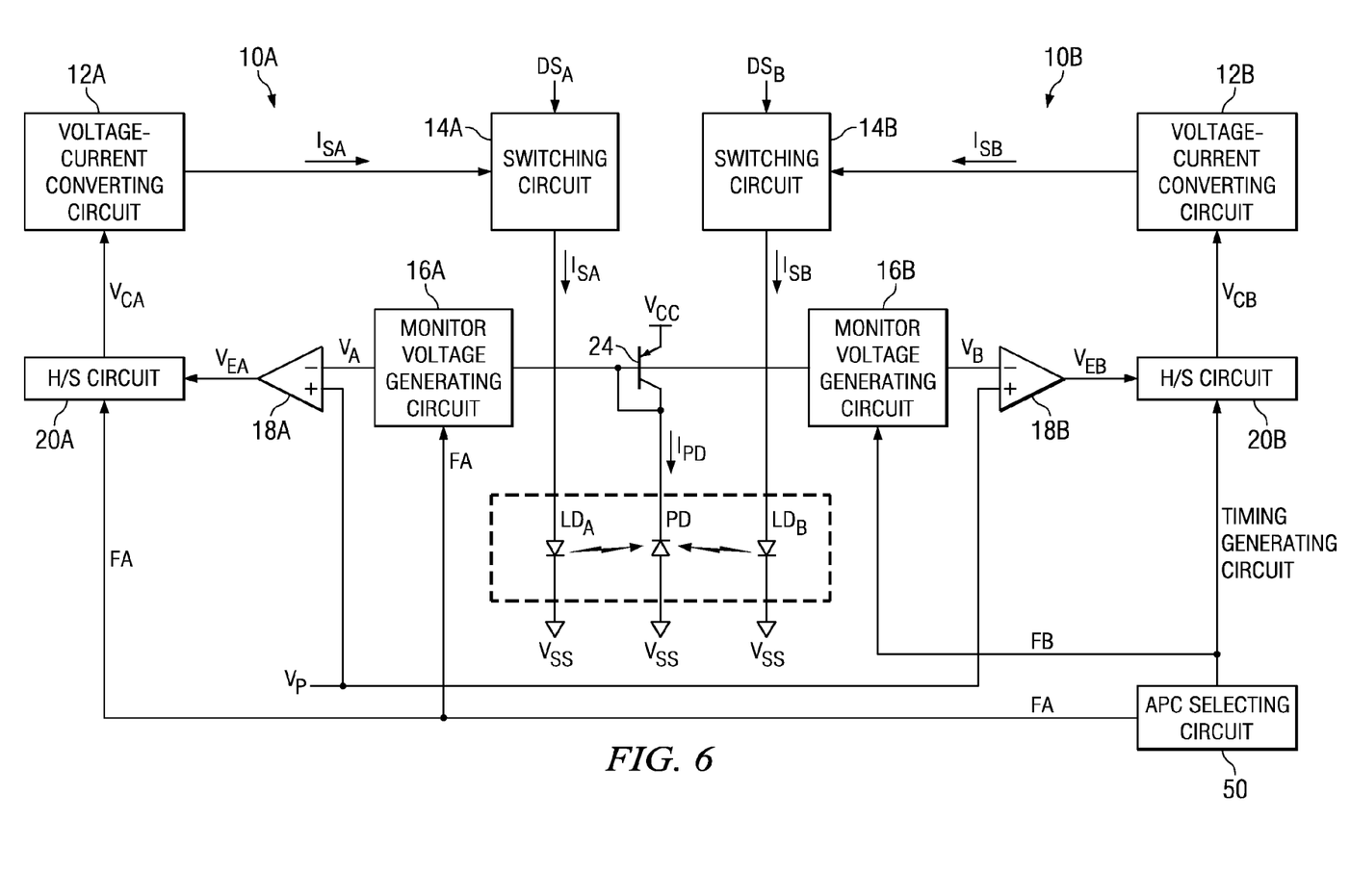
FIG. 6 is a block diagram showing a device constitution of a case where a timing generating circuit is excluded from the two-channel laser diode driving gear of the embodiment (comparative example).
Figure 7:
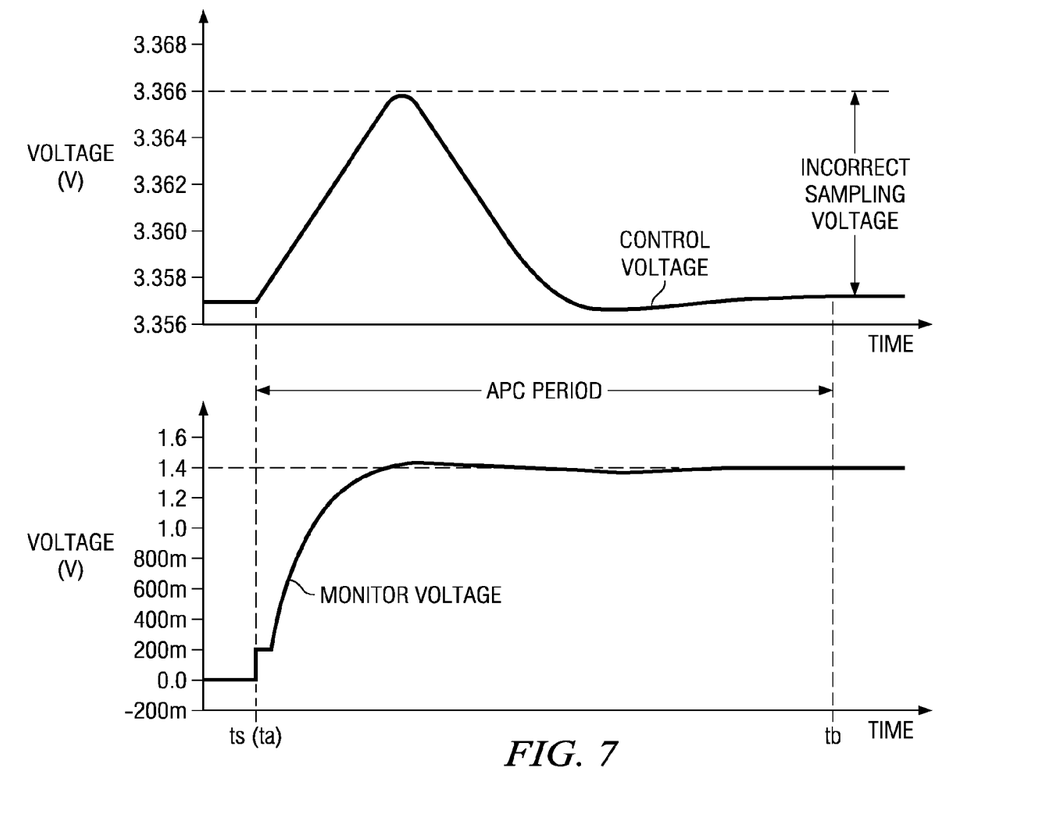
FIG. 7 is a waveform diagram showing waveforms of a monitor voltage and a control voltage in an APC operation of the device constitution (comparative example) of FIG. 6.

Here, for easy understanding of the operation effects in the APC operation of this embodiment, a device constitution excluding the timing generating circuits 22A and 22B from the two-channel laser diode driving gear (FIG. 1) in this embodiment is shown in FIG. 6, and a waveform of the monitor voltages ($V_A$, $V_B$) and the control voltages ($V_{CA}$, $V_{CB}$) in the APC operation of the device constitution of FIG. 6 is shown in FIG. 7.

In the device constitution of FIG. 6, APC selection signals FA and FB from the APC selecting circuit 50 are also directly given to the S/H circuits 20A and 20B at the same timing as that for the monitor voltage generating circuits 16A and 16B. For this reason, immediately after the start of the APC operation, when the monitor signals $V_A$ and $V_B$ are output from the monitor voltage generating circuits 16A and 16B, the S/H circuits 20A and 20B are switched from the hold mode at that time to the sampling mode, and a feedback control operation of a closed loop is started. Thus, even if the control voltages ($V_{CA}$, $V_{CB}$) are little changed before and after the APC operation, as shown in FIG. 7, the control voltage must be raised and lowered significantly (that is, a large increase and decrease in the driving current) at each cycle. For this reason, an over current flows to the laser diodes $LD_A$ and $LD_B$ in the APC operation, and the APC period (the time required for the APC) is lengthened.

In the above-mentioned embodiment, the gear for driving the laser diodes $LD_A$ and $LD_B$ of two channels has been explained, but the present invention can also be applied to a multichannel laser diode driving gear for driving a laser diode of 3 channels or more.

Figure 8:
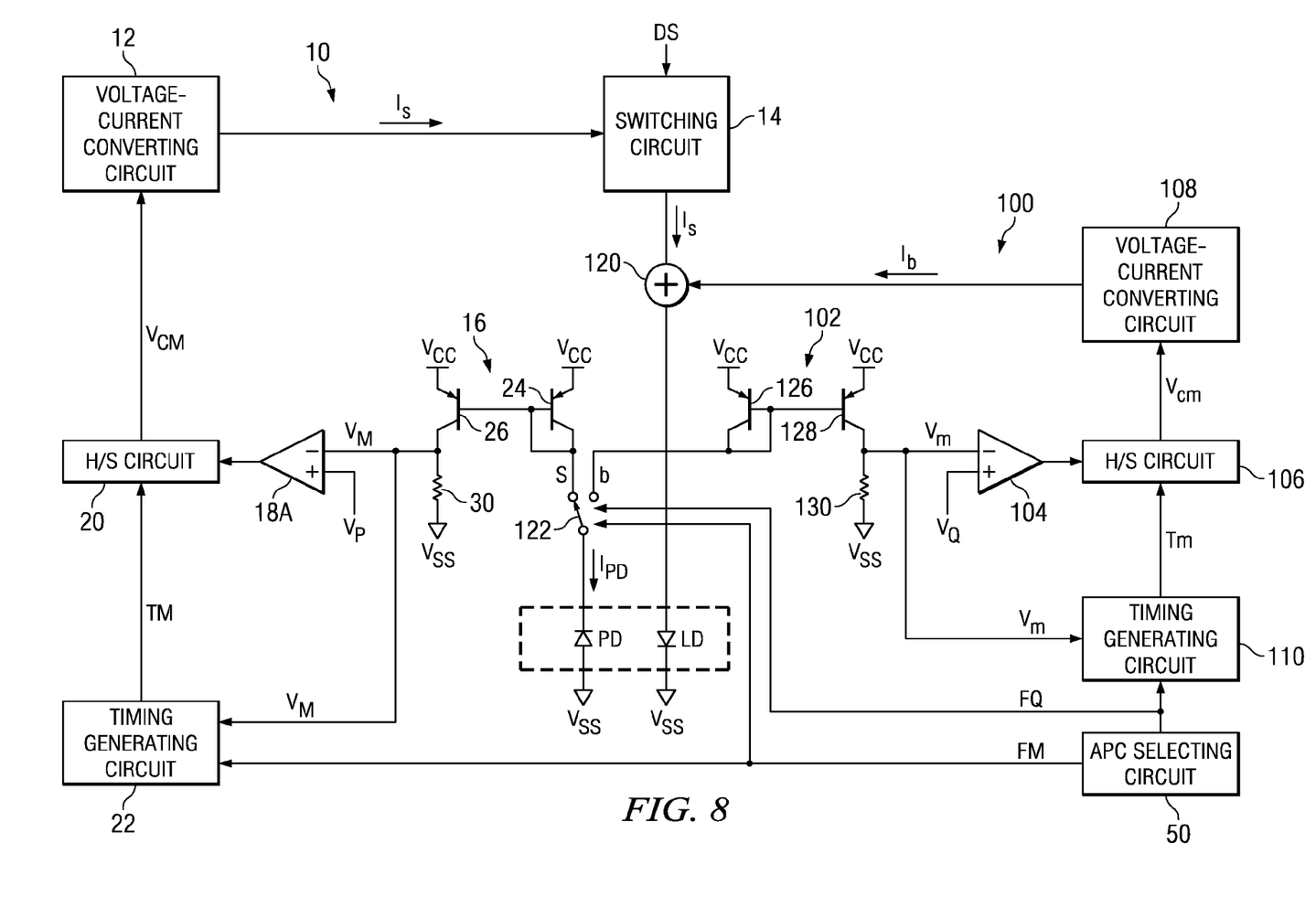
FIG. 8 is a block diagram showing the constitution of the laser diode driving gear in another embodiment.

Furthermore, the present invention can also be applied to a laser diode driving gear provided with a bias current supply circuit and a bias APC function as shown in FIG. 8, for instance. In FIG. 8, the laser diode driving gear has LD driving part 10 for driving the light emission of the laser diode LD, bias current supply part 100 for supplying a bias current to the laser diode LD, current adding circuit 120, APC changeover switch 122, and APC selecting circuit 124.

The LD driving part 10 corresponds to the first LD driving part 10A or second LD driving part 10B in the above-mentioned two-channel laser diode driving gear (FIG. 1) and consists of voltage-current converting circuit 12, switching circuit 14, photodiode PD, monitor voltage generating circuit 16, error amplifying circuit 18, S/H circuit 20, and timing generating circuit (mode switching circuit) 22. The voltages, currents, or signals in each part of the LD driving part 10, especially monitor voltage $V_M$, error voltage $V_{EM}$, control voltage $V_{CM}$, switching current $I_S$, and mode switching signal TM respectively correspond to the monitor voltage $V_A$, error voltage $V_{EA}$, control voltage $V_{CA}$, switching current $I_{SA}$, and mode switching signal TA in the first LD driving part 10A (FIG. 1), for instance.

The bias current supply part 100 injects a direct-current bias current set in the vicinity of its threshold current value $I_{TH}$ into the laser diode LD. In other words, generally, an inflection point called an oscillation threshold or threshold current value $I_{TH}$ exists in the driving current-optical output characteristic of the laser diode, and laser oscillation (light emission) is carried out by a driving (injection) current greater than the threshold current value $I_{TH}$. For this reason, if the driving current $I_S$ is increased from zero to make the laser diode LD emit a light, the laser oscillation (light emission) starts when the switching current, that is, the driving current $I_S$ exceeds the threshold current value $I_{TH}$. In other words, a delay time until the switching current $I_S$ reaches the threshold current value $I_{TH}$ exists. Accordingly, a direct-current bias current $I_b$ set in the vicinity of the threshold current value $I_{TH}$ is injected into the laser diode LD, the switching current $I_S$ with a fixed current value is supplied (injected) in a form in which it is stacked on the bias current $I_b$ for a pulse period, and the optical output of the laser diode LD follows the switching current $I_s$ and is raised at high speed.

The bias current supply part 100 consists of photodiode PD, monitor voltage generating circuit 102, error amplifying circuit 104, S/H circuit 106, voltage-current converting circuit 108, and timing generating circuit (mode switching circuit) 110. The photodiode PD is shared in a time division by the LD driving part 10 and the bias current supply part 100. In other words, when an APC operation for resetting the current value of the switching current $I_S$ is performed in the LD driving part 10, the APC changeover switch 122 is switched to a terminal s by the APC selecting circuit 50, and the photodiode PD is connected to the monitor voltage generating circuit 16 of LD driving part 10. Also, when bias APC operation is performed to reset bias current $I_b$ in bias current supply part 100, APC switch 122 is switched to the side of terminal b by APC selecting circuit 50, and photodiode PD is connected to the monitor voltage generating circuit 102 of bias current supply part 100.

In the bias current supply part 100, the monitor voltage generating circuit 102 consists of a PNP transistor 126 that can be connected in series to the photodiode PD via the APC changeover switch 122 between the positive electrode side power supply voltage terminal $V_{CC}$ and the negative electrode side power supply voltage terminal $V_{SS}$, a PNP transistor 128 constituting a current mirror circuit along with the PNP transistor 126, and a monitor resistor 130 connected in series with the PNP transistor 128 between the positive electrode side power supply voltage terminal $V_{CC}$ and the negative electrode side power supply voltage terminal $V_{SS}$. In the bias APC operation, if the laser diode LD emits light and the photocurrent $I_{PD}$ corresponding to the optical output flows in the photodiode PD, a monitor voltage $V_M$ shown by $V_M = R_{130} \cdot n I_{PD}$ is output from the positive electrode side terminal of the monitor resistor 130. Here $R_{130}$ is a resistance value of the monitor resistor 130, and n is a current mirror ratio.

The error amplifying circuit 104 is constituted by an operational amplifier, inputs the monitor voltage $V_m$ output from the monitor voltage generating circuit 102 into one (negative polarity) input terminal, inputs a reference voltage $V_Q$ for the bias APC from a reference voltage generating circuit (not shown in the figure) into the other input terminal (positive polarity), and outputs an error voltage $V_{em}$ corresponding to the difference between two input voltages $V_A$ and $V_Q$. Here, bias APC reference voltage $V_Q$ is set at a value in which the closed loop of the bias APC is in an equilibrium state when the laser diode LD emits light by the optical output nearly corresponding to its threshold current value $I_{TH}$.

The S/H circuit 106 samples the error voltage $V_{em}$ from the error amplifying circuit 104 and holds it and switches the mode by the output signal (mode switching signal) Tm of the timing generating circuit 110. For example, when Tm=H level, the mode is switched to the sampling mode, and when Tm=L level, the mode is switched to the hold mode. The voltage-current converting circuit 108 generates a bias current $I_b$ with a current value corresponding to the control voltage $V_{cm}$ from the S/H circuit 106.

The current adding circuit 120 includes a current driving circuit, adds the bias current $I_b$ from the bias current supply part 100 and the switching current $I_s$ of the LD driving part 10, and then injects the synthesized current $(I_b+I_s)$ as a laser driving current into the laser diode LD.

In this laser diode driving gear, for example, the bias APC operation of the bias current supply part 100 and the APC operation of the ID driving part 10 are sequentially implemented in this sequence for a line scanning period, for instance. When the bias APC operation is carried out by the bias current supply part 100, the APC selecting circuit 124 sets the APC selection signal FQ at H level while maintaining the APC selection signal FM fort the LD driving part 10 at L level. When the APC selection signal FQ is at H level, the APC changeover switch 122 is switched from the off position at that time to the position of the terminal b, and the photodiode PD is connected to the monitor voltage generating circuit 102 of the bias current supply part 100. Also, the switching circuit 14 of the LD driving part 10 is forcedly held in the off-state so that the current adding circuit 120 supplies only the bias current $I_b$ from the bias current supply part 100 to the laser diode LD.

The bias APC operation of the bias current supply part 100 is basically the same as the APC operation of the first LD driving part 10A in the laser diode driving gear (FIG. 1)

except that the current value of the current $I_b$ supplied or injected into the laser diode LD is reset in the vicinity of the threshold current value $I_{TH}$. In other words, until the monitor voltage Vm reaches the vicinity of the reference voltage $V_Q$ from the start of the bias APC operation, the S/H circuit 106 is held in the hold mode, and the laser diode LD is driven at a bias current $I_b$ of the same current value (the current value reset by the previous bias APC operation) as before the start of the bias APC operation. After the monitor voltage Vm reaches the vicinity of the reference voltage $V_Q$, the S/H circuit 106 is switched to the sampling mode, and a feedback control operation of a closed loop is started. Thus, the width of raising and lowering of the control voltage $V_{cm}$ during the bias APC operation is very narrow, and the time required until completion from the start of the bias AP operation can be shortened.

When the bias AP operation is finished by the bias current supply part 100, the APC selecting circuit 124 sets the APC selection signal FQ at L level. Thus, the output signal Tm of the timing generating circuit 110 is changed from H level to L level in response to the APC selection signal FQ at L level, and the S/H circuit 106 is switched from the sampling mode to the hold mode. Also, the bias APC changeover switch 122 is switched from the position of the terminal b to the off position in response to the APC selection signal FQ at L level.

Next, the APC selecting circuit 124 sets the APC selection signal FM for the LD driving part 10 to H level to make the LD driving part 10 implement the APC operation. If the APC selection signal FQ is at H level, the APC changeover switch 122 is switched from the off position to the position of the terminal s, and the photodiode PD is connected to the monitor voltage generating circuit 16 of the LD driving part 10. Also, the switching circuit 14 of the LD driving part 10 is forcedly held in the on-state.

The APC operation of the LD driving part 10 is also almost the same as the APC operation of the first LD driving part 10A in the above-mentioned two-channel laser diode driving gear (FIG. 1) except that the bias current $I_b$ from the bias current supply part 100 is added to the switching current Is and injected into the laser diode LD. In other words, until the monitor voltage $V_M$ reaches the vicinity of the reference voltage $V_P$ from the start of the bias APC operation, the S/H circuit 20 is held in the hold mode, and the laser diode LD is driven at the switching current Is of the same current value (the current value reset by the previous bias APC operation) as before the bias APC operation start. After the monitor voltage $V_M$ reaches the vicinity of the reference voltage $V_P$, the S/H circuit 20 is switched to the sampling mode, and a feedback control operation of a closed loop is started. Thus, the width of raising and lowering of the control voltage $V_{CM}$ during the bias APC operation is very narrow, and the time required until completion from the start of the bias APC operation can be shortened. Also, since a substantial overcurrent is not sent to the laser diode LD from the APC, degradation of the laser diode characteristics and a decrease in reliability can be prevented.

Also, in the present invention, the constitution of the entire device or each part can be variously modified. For example, in the above-mentioned embodiment, in switching the S/H circuit 20A from the sampling mode to the hold mode to finish the APC operation of the LD driving part 10A, the APC selection signal FA is returned to L level from H level after a lapse of prescribed time from the moment when the APC selecting circuit 50 starts the APC operation, and the timing generating circuit 22A returns its output signal TA to L level from H level. As one modification, based on the point in time when the S/H circuit 20A is switched from the hold mode to the sampling mode, after the lapse of a prescribed time from that point in time, the timing generating circuit 22A returns its output signal TA to L level from H level, and the S/H circuit 20A can also be switched from the sampling mode to the hold mode at that timing. Also, in the monitor voltage generating circuits 16, 16A, 16B, and 102, the monitor resistors 30 and 130 are connected in series with the photodiode PD, and the monitor voltage can also be extracted from the ends of the monitor resistors 30 and 130.

Also, the driving gear of the present invention is especially suitable for driving the light emission of a laser diode, but it can also be applied to the light emission driving of other current injection type light-emitting devices.

While the invention has been particularly shown and described with reference to preferred embodiments thereof it is well understood by those skilled in the art that various changes and modifications can be made in the invention without departing from the spirit and scope of the invention as defined by the appended claims.

The invention claimed is:

1. A light-emitting device driver, comprising:
   a light-receiving device for converting the optical output of a light-emitting device into a photocurrent;
   a monitor voltage generating circuit that has a monitor resistor, in which current proportional the photocurrent of the light-receiving device flows, and an on/off switch for switching the current proportional to the photocurrent and outputs a monitor voltage corresponding to the voltage drop of the monitor resistor;
   an error amplifying circuit that compares the monitor voltage output with a reference voltage corresponding to a set value of the optical output of the light-emitting device and outputs an error voltage corresponding to the difference;
   a sample-and-hold circuit in which the input terminal is connected to the output terminal of the error amplifying circuit and one of a sampling mode for sampling and outputting the error voltage from the error amplifying circuit and a hold mode for holding the output voltage, regardless of the current input voltage, can be selectively switched;
   a driving current generating circuit for generating a driving current with a current value corresponding to the output voltage of the sample-and-hold circuit to drive the light emission of the light-emitting device; and
   a mode switching circuit that monitors the monitor voltage output from the monitor voltage generating circuit after the on/off switch of the monitor voltage generating circuit is switched from the on-state to the off-state to reset the driving current, detects the arrival timing of the monitor voltage to substantially the reference voltage, and switches the sample-and-hold circuit from the hold mode to the sampling mode.

2. The light-emitting device driver of claim 1, wherein the mode switching circuit has a differentiating circuit that receives the monitor voltage and generates an output voltage and an output circuit that receives the output voltage of the differentiating circuit and outputs a first switching signal to switch the sample-and-hold circuit from the hold mode to the sampling mode when the voltage drops to substantially zero.

3. The light-emitting device driver of claim 2, wherein the differentiating circuit is constituted by connecting a capacitor and a resistor in series; and a voltage between the ends of the resistor is the output voltage of the differentiating circuit.

4. The light-emitting device driver of claim 3, wherein the output circuit has a comparator in which a first input means is connected to one end of the resistor, a second input terminal is connected to the other end of the resistor, the amplitude of a first input voltage input into the first input terminal and a second input voltage input into the second input terminal is compared, and a binary signal showing the comparison result is output as the first mode switching signal.

5. The light-emitting device driving gear of claim 4, wherein the output circuit has a bypass circuit connected to one end of the resistor and the first input terminal of the comparator to give a prescribed bias to the input of the comparator.

6. The light-emitting device driving gear of claim 4, wherein the output circuit has a bypass circuit connected to the other end of the resistor and the second input terminal of the comparator to give a prescribed bias to the input of the comparator.

7. The light-emitting device driving gear of claim 5 wherein the comparator has first and second bipolar transistors in which each base is connected to the first and second input terminals to constitute a differential input part.

8. The light-emitting device driver of claim 1, wherein the mode switching circuit has a differentiating circuit that receives the monitor voltage and generates a transient current from the monitor voltage; and an output circuit that outputs a first switching signal to switch the sample-and-hold circuit from the hold mode to the sampling mode when the current value of the transient current being generated in the differentiating circuit is reduced to substantially zero.

9. The light-emitting device driver of claim 1 further comprising a switching circuit connected to the light-emitting device in series with the output terminal of the driving current generating circuit and sends the driving current from the driving current generating circuit or cuts off the driving current in accordance with the logical level of an input signal given as a binary signal or pulse signal.

10. The light-emitting device driver of claim 1 wherein the monitor voltage generating circuit has a first transistor connected to the light-receiving device in series and a second transistor constituting a current mirror circuit along with the first transistor; and the monitor resistor and the on/off switch are connected to the second transistor in series.

11. The light-emitting device driver of claim 1 wherein after the lapse of a prescribed time from the moment at which the on/off switch of the monitor voltage generating circuit is switched from the on-state to the off-state, the mode switching circuit outputs a second switching signal due to switching the sample-and-hold circuit from the sampling mode to the hold mode.

12. The light-emitting device driver of claim 11 wherein a mode selecting circuit for switching the on/off switch of the monitor voltage generating circuit from the on-state to the off-state, almost at the same time that the sample-and-hold circuit is switched from the sampling mode to the hold mode by the mode switching circuit, is provided.

13. The light-emitting device driver of claim 12 wherein the mode selecting circuit is switched from the off-state to the on-state of the on/off switch.

14. The light-emitting device of claim 13, wherein the mode selecting circuit selects switching from the hold mode to the sampling mode of the sample-and-hold circuit and switching from the sampling mode to the hold mode through the mode switching circuit.

15. The light-emitting device driver of claim 1 wherein the light-emitting device is a laser diode.

16. A light-emitting device driver comprising:
a light-receiving device for converting into a photocurrent the optical output of a first or second light-emitting device for selectively emitting light;
a first monitor voltage generating circuit that has a first monitor resistor, in which a current proportional to the photocurrent of the light-receiving device flows when the first light-emitting device emits light;
a first on/off switch for switching the current proportional to the photocurrent and outputs a monitor voltage corresponding to the voltage drop of the first monitor resistor;
a first error amplifying circuit that compares the output voltage of the first monitor voltage generating circuit with a first reference voltage corresponding to a set value of the optical output of the first light-emitting device and generates an error voltage corresponding to the difference;
a first sample-and-hold circuit in which the input terminal is connected to the output terminal of the first error amplifying circuit in either a sampling mode for sampling and outputting the error voltage from the first error amplifying circuit or a hold mode for holding the output voltage, regardless of the current input voltage, can be selectively switched;
a first driving current generating circuit for generating a first driving current with a current value corresponding to the output voltage of the first sample-and-hold circuit to drive the light emission of the first light-emitting device;
a first mode switching circuit that monitors the first monitor voltage being output from the first monitor voltage generating circuit after the first on/off switch of the first monitor voltage generating circuit is switched from the on-state to the off-state to reset the first driving current, detects the arrival timing of the first monitor voltage to substantially the first reference voltage, and switches the first sample-and-hold circuit from the hold mode to the sampling mode;
a second monitor voltage generating circuit that has a second monitor resistor, in which a second output current proportional to the photocurrent of the light-receiving device flows when the second light-emitting device emits light, and a second on/off switch for switching the current proportional to the photocurrent and outputs a second monitor voltage corresponding to the voltage drop of the second monitor resistor;
a second error amplifying circuit that compares the output voltage of the second monitor voltage generating circuit with a second reference voltage corresponding to a set value of the optical output of the second light-emitting device and generates an error voltage corresponding to the difference;
a second sample-and-hold circuit in which the input terminal is connected to the output terminal of the second error amplifying circuit in either a sampling mode for sampling and outputting the error voltage from the second error amplifying circuit or a hold mode for holding the output voltage, regardless of the current input voltage, can be selectively switched;
a second driving current generating circuit for generating a second driving current with a current value corresponding to the output voltage of the second sample-and-hold circuit to drive the light emission of the second light-emitting device; and
a second mode switching circuit that monitors the second monitor voltage being output from the second monitor voltage generating circuit after the second on/off switch of the second monitor voltage generating circuit is switched from the on-state to the off-state to reset the second driving current, detects the arrival timing of the second monitor voltage to the vicinity of the second reference voltage, and switches the second sample-and-hold circuit from the hold mode to the sampling mode.

17. A light-emitting device driver comprising a light-receiving device for converting into a photocurrent the optical output of a light-emitting device for selectively emitting light;
- a first monitor voltage generating circuit that has a first monitor resistor, in which a current proportional to the photocurrent of the light-receiving device flows selectively when the light-emitting device emits light, and outputs a first monitor voltage corresponding to the voltage drop of the first monitor resistor;
- a first error amplifying circuit that compares the output voltage of the first monitor voltage generating circuit with a first reference voltage corresponding to a set value of the optical output of the light-emitting device and generates an error voltage corresponding to the difference;
- a first sample-and-hold circuit in which the input terminal is connected to the output terminal of the first error amplifying circuit in either a sampling mode for sampling and outputting the error voltage from the first error amplifying circuit or a hold mode for holding the output voltage, regardless of the current input voltage, can be selectively switched;
- a driving current generating circuit for generating a driving current with a current value corresponding to the output voltage of the first sample-and-hold circuit to drive the light emission of the light-emitting device;
- a second monitor voltage generating circuit that has a second monitor resistor, in which a second output current proportional to the photocurrent of the light-receiving device flows when the light-emitting device emits light, and outputs a second monitor voltage corresponding to the voltage drop of the second monitor resistor;
- a second error amplifying circuit that compares the output voltage of the second monitor voltage generating circuit with a second reference voltage corresponding to a bias current set value selected substantially at a threshold current value of the light-emitting device and generates an error voltage corresponding to the difference;
- a second sample-and-hold circuit in which the input terminal is connected to the output terminal of the second error amplifying circuit in either a sampling mode for sampling and outputting the error voltage from the second error amplifying circuit or a hold mode for holding the output voltage, regardless of the current input voltage, can be selectively switched;
- a bias current generating circuit for generating a bias current with a current value corresponding to the output voltage of the second sample-and-hold circuit to bias the light-emitting device;
- a changeover switch that can be switched to a first switch position for sending the current proportional to the photocurrent to the first monitor resistor or a second switch position for sending the photocurrent or the second output current to the second monitor resistor, when the light-emitting device emits light;
- a first mode switching circuit that monitors the first monitor voltage output from the first monitor voltage generating circuit after the changeover switch is switched to the first switch position to reset the driving current, detects the arrival timing of the first monitor voltage to substantially the first reference voltage, and switches the first sample-and-hold circuit from the hold mode to the sampling mode; and
- a second mode switching circuit that monitors the second monitor voltage output from the second monitor voltage generating circuit after the changeover switch is switched to the second switch position to reset the driving current, detects the arrival timing of the second monitor voltage to substantially the second reference voltage, and switches the second sample-and-hold circuit from the hold mode to the sampling mode.

* * * * *